(12) United States Patent  (10) Patent No.: US 8,338,307 B2
De Vries et al.  (45) Date of Patent: Dec. 25, 2012

(54) SUBSTRATE PLASMA TREATMENT USING MAGNETIC MASK DEVICE

(75) Inventors: Hindrik Willem De Vries, Tilburg (NL); Bruno Alexander Korngold, Drunen (NL)

(73) Assignee: Fujifilm Manufacturing Europe B.V., Tilburg (NL)

( * ) Notice: Subject to any disclaimer, the term of this patent is extended or adjusted under 35 U.S.C. 154(b) by 517 days.

(21) Appl. No.: 12/526,944

(22) PCT Filed: Feb. 1, 2008

(86) PCT No.: PCT/NL2008/050054
§ 371 (c)(1),
(2), (4) Date: Feb. 7, 2010

(87) PCT Pub. No.: WO2008/100139
PCT Pub. Date: Aug. 21, 2008

(65) Prior Publication Data
US 2010/0147794 A1  Jun. 17, 2010

(30) Foreign Application Priority Data
Feb. 13, 2007  (EP) ................................. 07102269

(51) Int. Cl.
*H01L 21/302* (2006.01)
*H01L 21/461* (2006.01)
(52) U.S. Cl. ........ 438/706; 438/707; 438/710; 438/723; 438/725
(58) Field of Classification Search .................... None
See application file for complete search history.

(56) References Cited

U.S. PATENT DOCUMENTS

| 4,478,878 A | 10/1984 | Neuwald |
| 4,631,199 A | 12/1986 | Hall et al. |
| 4,681,780 A | 7/1987 | Kamman |
| 5,187,457 A | 2/1993 | Chawla et al. |
| 5,288,518 A | 2/1994 | Homma |

(Continued)

FOREIGN PATENT DOCUMENTS

DE  44 38 533 A1  5/1996

(Continued)

OTHER PUBLICATIONS

Lee, et al.—"Investigation of Silicon Oxide Thin Films Prepared by Atomic Layer Deposition using SiH2Cl2 and O3 as the Precursors" —Japanese Journal of Applied Physics, vol. 43, No. 3A, 2004, pp. L328-L330.

(Continued)

*Primary Examiner* — Duy Deo
(74) *Attorney, Agent, or Firm* — Gilberto M. Villacorta; Sunit Talapatra; Foley & Lardner LLP

(57) ABSTRACT

Plasma treatment apparatus and method for treatment of a surface of a substrate. A dielectric barrier discharge electrode structure is provided having a treatment space (5) and comprising a first electrode (2) and a second electrode (3), and a power supply (11) connected to the first electrode (2) and the second electrode (3) for generating an atmospheric pressure plasma in the treatment space (5). The plasma treatment apparatus further comprises a magnetic layer (6) provided on a surface of at least the first electrode (2). The first electrode (2) is arranged to receive, in operation, the substrate (1) to be treated and a mask device (7) in contact with the substrate (1), the mask device (7) interacting with the magnetic layer (6).

19 Claims, 2 Drawing Sheets

U.S. PATENT DOCUMENTS

| | | | |
|---|---|---|---|
| 5,576,076 | A | 11/1996 | Slootman et al. |
| 5,660,744 | A * | 8/1997 | Sekine et al. ............. 219/121.43 |
| 5,710,067 | A | 1/1998 | Foote et al. |
| 5,800,877 | A | 9/1998 | Maeda et al. |
| 6,159,559 | A | 12/2000 | Reber et al. |
| 6,413,645 | B1 | 7/2002 | Graff et al. |
| 6,464,779 | B1 | 10/2002 | Powell et al. |
| 6,534,421 | B2 | 3/2003 | Kakkad |
| 6,613,394 | B2 | 9/2003 | Kuckertz et al. |
| 6,652,924 | B2 | 11/2003 | Sherman |
| 6,756,318 | B2 | 6/2004 | Nguyen et al. |
| 6,774,569 | B2 | 8/2004 | De Vries et al. |
| 6,835,425 | B2 | 12/2004 | Fukuda et al. |
| 6,861,334 | B2 | 3/2005 | Raaijmakers et al. |
| 6,955,836 | B2 | 10/2005 | Kumagai et al. |
| 7,098,131 | B2 | 8/2006 | Kang et al. |
| 7,298,072 | B2 | 11/2007 | Czeremuszkin et al. |
| 7,491,429 | B2 | 2/2009 | De Vries et al. |
| 7,533,628 | B2 | 5/2009 | Bewig et al. |
| 7,709,159 | B2 | 5/2010 | Umetsu et al. |
| 2002/0011462 | A1 * | 1/2002 | Richter et al. .................. 216/41 |
| 2002/0150839 | A1 | 10/2002 | Peng |
| 2003/0118748 | A1 | 6/2003 | Kumagai et al. |
| 2004/0146660 | A1 | 7/2004 | Goodwin et al. |
| 2005/0079418 | A1 | 4/2005 | Kelley et al. |
| 2005/0084610 | A1 | 4/2005 | Selitser |
| 2005/0085077 | A1 * | 4/2005 | Ogawa et al. .................. 438/689 |
| 2005/0093458 | A1 | 5/2005 | Babayan et al. |
| 2006/0231908 | A1 | 10/2006 | Liu et al. |
| 2007/0105389 | A1 * | 5/2007 | Narishige ..................... 438/710 |
| 2008/0317974 | A1 | 12/2008 | De Vries et al. |
| 2009/0238997 | A1 | 9/2009 | De Vries et al. |
| 2009/0304949 | A1 | 12/2009 | De Vries et al. |
| 2009/0324971 | A1 | 12/2009 | De Vries et al. |
| 2011/0014424 | A1 | 1/2011 | De Vries |
| 2011/0042347 | A1 | 2/2011 | Korngold et al. |
| 2011/0049491 | A1 | 3/2011 | De Vries et al. |
| 2011/0089142 | A1 | 4/2011 | Korngold et al. |

FOREIGN PATENT DOCUMENTS

| | | |
|---|---|---|
| DE | 10 2004 043 384 A1 | 3/2006 |
| EP | 0 889 506 A2 | 1/1999 |
| EP | 1 340 838 A1 | 9/2003 |
| EP | 1 351 321 A2 | 10/2003 |
| EP | 1 381 257 A2 | 1/2004 |
| EP | 1 383 359 A2 | 1/2004 |
| EP | 1 403 902 A1 | 3/2004 |
| EP | 1 029 702 B1 | 4/2004 |
| EP | 1 548 795 A1 | 6/2005 |
| EP | 1 626 613 A1 | 2/2006 |
| EP | 1 750 294 A1 | 2/2007 |
| EP | 1 371 752 B1 | 5/2008 |
| JP | 58-111380 A | 7/1983 |
| JP | 58-217344 A | 12/1983 |
| JP | 64-33932 A | 2/1989 |
| JP | 04-094169 A | 3/1992 |
| JP | 07-074110 A | 3/1995 |
| JP | 2000-026632 A | 1/2000 |
| JP | 2000-313962 A | 11/2000 |
| JP | 2003-206361 A | 7/2003 |
| JP | 2006-4740 A | 1/2006 |
| WO | WO-99/04411 A1 | 1/1999 |
| WO | WO-01/15220 A1 | 3/2001 |
| WO | WO-01/69644 A1 | 9/2001 |
| WO | WO-03/005461 A1 | 1/2003 |
| WO | WO-2004/019381 A2 | 3/2004 |
| WO | WO-2004/030019 A1 | 4/2004 |
| WO | WO 2005/033189 A1 | 4/2005 |
| WO | WO-2005/049228 A2 | 6/2005 |
| WO | WO-2005/062337 A1 | 7/2005 |
| WO | WO-2005/062338 A1 | 7/2005 |
| WO | WO 2007/013703 A1 | 2/2007 |
| WO | WO-2007/024134 A1 | 3/2007 |
| WO | WO-2007/078556 A1 | 7/2007 |
| WO | WO-2007/089146 A1 | 8/2007 |
| WO | WO-2007/091891 A1 | 8/2007 |
| WO | WO-2007/139379 A1 | 12/2007 |
| WO | WO-2007/145513 A1 | 12/2007 |
| WO | WO-2009/096785 A1 | 8/2009 |
| WO | WO-2009/099325 A1 | 8/2009 |
| WO | WO-2010/092384 A1 | 8/2010 |

OTHER PUBLICATIONS

Affinito et al., "A new method for fabricating transparent barrier layers," Thin Solid Films, vols. 290-291, 1996, pp. 63-67.

Babayan et al., "Deposition of silicon dioxide films with an atmospheric-pressure plasma jet," Plasma Sources Sci. Technol., vol. 7, 1998, pp. 286-288.

Bletzinger et al., "The effect of displacement current on fast-pulsed dielectric barrier discharges," J Phys D Appl Phys, vol. 36, No. 13, 2003, pp. 550-1552.

Buss et al., "Synthesis of Silicon Nitride Particles in Pulse Radio Frequency Plasmas," J Vac Sci Technol.A, vol. 14, No. 2, 1996, pp. 577-581 [XP-002391555].

Gherardi et al., "A new approach to SiO2 deposit using a N2-SiH4-N2O glow dielectric barrier-controlled discharge at atmospheric pressure," J.phys. D: Appl. Phys., vol. 33, 2000, pp. L104-L108.

International Search Report for PCT/NL2008/050054, dated May 19, 2008, 3 pages.

Martin et al., "Atmospheric pressure PE-CVD of silicon based coatings using a glow dielectric barrier discharge," Surface and Coatings Technology, 177-178, 2004, pp. 693-698.

Watanabe et al., "Formation Kinetics and Control of Dust Particles in Capacitively-Coupled Reactive Plasmas," Physica Scripta, vol. T89, 2001, pp. 29-32 [XP008066859].

Kanazawa et al., "Glow Plasma Treatment at Atmospheric Pressure for Surface Modification and Film Deposition," Nuclear Instruments and Methods in Physics Research, Feb. 1989, vols. 37-38, Beam Interactions with Materials and Atoms, pp. 842-845.

* cited by examiner

SUBSTRATE PLASMA TREATMENT USING MAGNETIC MASK DEVICE

PRIOR RELATED APPLICATIONS

This application is a U.S. National Stage filing of application no. PCT/NL2008/050054, filed Feb. 1, 2008, which claims priority to European application no. 07102269.3, filed Feb. 13, 2007.

FIELD OF THE INVENTION

The present invention relates to a method for treatment of a substrate surface using atmospheric pressure plasma, the method comprising providing a dielectric barrier discharge electrode structure for generating an atmospheric pressure plasma in a treatment space between a first electrode and a second electrode. In a further aspect, the present invention relates to a plasma treatment apparatus for treatment of a surface of a substrate, comprising a dielectric barrier discharge electrode structure having a treatment space and comprising a first electrode and a second electrode, and a power supply connected to the first electrode and the second electrode for generating an atmospheric pressure plasma in the treatment space. In a further aspect, the present invention relates to the use of the apparatus and the method of the present invention in various applications.

PRIOR ART

Photo-lithographic patterning is a common technique in semi conductor industry. Plasma etching can be applied to form patterns or structures on an object (for instance a wafer). The patterning technique consists of several time consuming steps: first (spin) coating of a photo resist, second irradiating the photo resist locally by using a mask device, third removing the exposed or non exposed photo resist (depending on the type of resist being positive or negative) and fourth the selective plasma etching treatment. An example of such a technique is given in European patent application EP 0 889 506 A2. This document discloses the use of a low pressure RF plasma discharge to pattern (etch) an object placed on one of the electrodes using a photolithographic patterning step.

Atmospheric pressure discharges have also been used to create patterns on a substrate, see e.g. international patent application WO 01/69644. In this patent micro-discharges are generated in small cavities by using a structured interlayer (i.e. the mask device) between the electrodes. Main disadvantages of this geometry are that the gas supply (refreshment) is very difficult or even impossible and the breakdown voltages become extremely high (even in helium). In order to force plasma ignition much higher voltages are to be applied.

Another solution to pattern a substrate is to make use of a solid re-usable mask device, see e.g. the US patent publication US 2006/0166111. In this patent publication a mask device is created by etching holes entirely through a silicon wafer. The silicon wafer is then glued on top of a glass plate to give increased strength. Then the mask device is placed on an object which is irradiated by a laser to etch parts of the irradiated substrate.

SUMMARY OF THE INVENTION

The present invention seeks to provide a plasma treatment method and apparatus and the use of the method and apparatus for treatment of the surface of a substrate using a plasma, which allows to provide a pattern on the substrate surface.

According to the present invention, a method according to the preamble defined above is provided, in which the method further comprises providing a magnetic layer on a surface of at least the first electrode in the treatment space, providing a substrate in contact with the magnetic layer, providing a mask device in contact with the substrate, the mask device interacting with the magnetic layer, and applying a plasma generating power to the first and second electrode for treatment of surface areas of the substrate exposed by the mask device (i.e. exposure of areas not covered by the mask device to the plasma in operation). The interaction between mask device and magnetic layer provides a close or intimate contact between the mask device and the substrate, i.e. there is basically no distance between the mask device and the substrate and if there would be a distance at all, the maximum distance between the mask device and the substrate is less than a predetermined distance, e.g. less than 1 micrometer, in order to prevent any air gaps. Without the application of a magnetic layer there might be a distance between the mask device and the substrate, as a result of which no accurate pattern will be taken over from the mask device on the substrate because of edge effects. The contact is furthermore plan-parallel, i.e. the maximum distance is achieved at any place over the entire substrate surface. In another embodiment the same provisions (mask device, substrate, magnetic layer foil) as applied on the first electrode are also applied to the second electrode. None of the prior art publications described above disclose the use of a mask device positioned on one of the electrodes of an atmospheric DBD system to pattern the substrate covered by the mask device. The present method allows to generate a bulk plasma in the treatment space at normal (low) breakdown voltages without any (structural) obstructions in the treatment space. The supply of reactive gasses (plasma) to the holes and gaps in the masking device near to the surface of the substrate is obtained by diffusion from the bulk plasma. The present method may also be applied to use the second electrode for treatment of a substrate, in which the second electrode is also provided with a magnetic layer, substrate and mask device.

The electrodes may be planar electrodes, which results in a rectangular treatment space, which allows easy and efficient treatment of flat surfaces of a substrate. The magnetic layer, substrate and mask device form a dielectric barrier on the first electrode, as a result of which the plasma discharge generated may be a very uniform plasma. In a further embodiment the plasma generated may be an atmospheric glow discharge plasma. Possibly, also the second electrode may be provided with a dielectric barrier, allowing to easier generate a uniform atmospheric pressure discharge plasma or glow discharge plasma in the treatment space.

The mask device may be made of a conductive or non-conductive material, e.g. a metallic or dielectric material, provided the material is able to interact with the magnetic layer. In a further embodiment, the material of the mask device is made from a material which has a magnetic permeability of at least 1 Tm/A, e.g. equal to or larger than 5 Tm/A. Very good results are obtained with the mask device having a magnetic permeability of 100, or 500 or 1000 Tm/A or any value in between. Material having such magnetic permeability can be selected from ferromagnetic material, or martensitic or austenitic material having ferromagnetic properties. This allows a positive attraction force between the mask device and the magnetic layer.

The thickness of the mask device may in an embodiment be less than 1 mm, e.g. less than 0.4 mm. The thickness may even be as low as 0.1 mm or even 0.05 mm. As a result the dielectric barrier is as small as possible and does not prevent a proper operation of the glow discharge plasma generation.

Also, the magnetic layer has a thickness which is in a further embodiment 1 mm or less than 1 mm, e.g. less than 0.5 mm. Again this allows to provide a proper dimension and characteristic of the dielectric barrier on the first electrode. In a further embodiment the thickness of the magnetic layer can be more than 1 mm e.g. 1.5 or 2 mm or even thicker. The magnetic layer may comprise alternating magnetic poles at a predefined pitch distance, in which the pitch distance is chosen such that the magnetic field extends through the substrate into the mask device to allow a sufficiently strong attraction force. In another embodiment the magnetic layer may comprise randomly oriented alternating magnetic poles with the condition, that the magnetic field extends through the substrate into the mask device to allow a sufficiently strong attraction force In a further embodiment, the magnetic layer has a magnetic force between 5 $g/cm^2$ and 100 $g/cm^2$, to effectively attract the mask device to the magnetic layer with the substrate in between.

In a further embodiment, the mask device is on a floating potential, grounded, or at first electrode potential. Depending on the type of material of the mask device and the substrate, one of the choices may provide for an optimum result.

Applying a plasma generating power to the electrodes comprises, in a further embodiment, controlling a displacement current to the first and second electrode. By using feedback control and further stabilization control, a uniform and efficient glow discharge plasma may be formed, in which filamentation of the dielectric barrier discharge plasma may be effectively suppressed. Filamentation would result in localized high density plasma, which may be disadvantageous in certain uses as it may result in dust formation in chemical vapor deposition applications of the present method embodiments. In other applications filamentation is less of a problem, and in such applications stabilization means are of less importance.

In a further aspect, the present invention relates to a plasma treatment apparatus as defined in the preamble above, the plasma treatment apparatus further comprising a magnetic layer provided on a surface of at least the first electrode (e.g. on top of the surface of the first electrode or as part of the first electrode), the first electrode being arranged to receive, in operation, the substrate to be treated and a mask device in contact with the substrate, the mask device interacting with the magnetic layer. The present apparatus allows to generate a bulk plasma in the treatment space at normal (low) breakdown voltages without any (structural) obstructions in the treatment space. The supply of reactive gasses (plasma) to the holes and gaps in the masking device near to the surface of the substrate is obtained by diffusion from the bulk plasma. The second electrode may also be provided with the magnetic layer, substrate and mask device in operation, allowing simultaneous treatment of two substrates.

The plasma treatment apparatus may further be arranged to comprise structural features enabling the method embodiments of the present invention. Furthermore, the present invention also relates to a mask device for use in a plasma treatment apparatus according to any of the present apparatus embodiments, in which the mask device is made of a material which may have a magnetic permeability of at least 1 Tm/A, e.g. equal to or larger than 5 Tm/A. Very good results are obtained with the mask device having a magnetic permeability of 100, or 500 or 1000 Tm/A or any value in between. Material having such magnetic permeability can be selected from ferromagnetic material, or martensitic or austenitic material having ferromagnetic properties, resulting in a positive attraction between the magnetic layer and the mask device, with the substrate in between.

In further aspects, the present invention relates to the use of the present method or apparatus for providing (or activating) a surface of a substrate with a predefined pattern, e.g. a pattern having sharp transitions (such as a transition of less than 10 µm, even less than 2 µm, or even less than 0.2 µm). Also, the present invention relates to the use of the present method or apparatus for providing a hydrophobic substrate with a predefined hydrophilic pattern (or a hydrophilic substrate with a hydrophobic pattern), for etching a surface of a substrate with a predefined pattern, and for depositing material in a predefined pattern on a surface of a substrate. The pattern can similarly have sharp transitions. The latter use (depositing material on a substrate) can be advantageously applied in printing applications for application of inks on a substrates with a predefined pattern. In an embodiment, a treated substrate is printed on using a material selected from the group consisting of: water based ink, conductive ink, gel based ink. In an embodiment, the use can be applied for providing sharp defined transitions between hydrophic and hydrophilic areas of the substrate, in which the transition length is less than 10 microns, e.g. less than 2 micron or even 0.2 micron.

SHORT DESCRIPTION OF DRAWINGS

The present invention will be discussed in more detail below, using a number of exemplary embodiments, with reference to the attached drawings, in which FIG. 1 shows a cross sectional view of a first embodiment of a plasma treatment apparatus according to a first embodiment of the present invention;

DETAILED DESCRIPTION OF EXEMPLARY EMBODIMENTS

Figure 1:
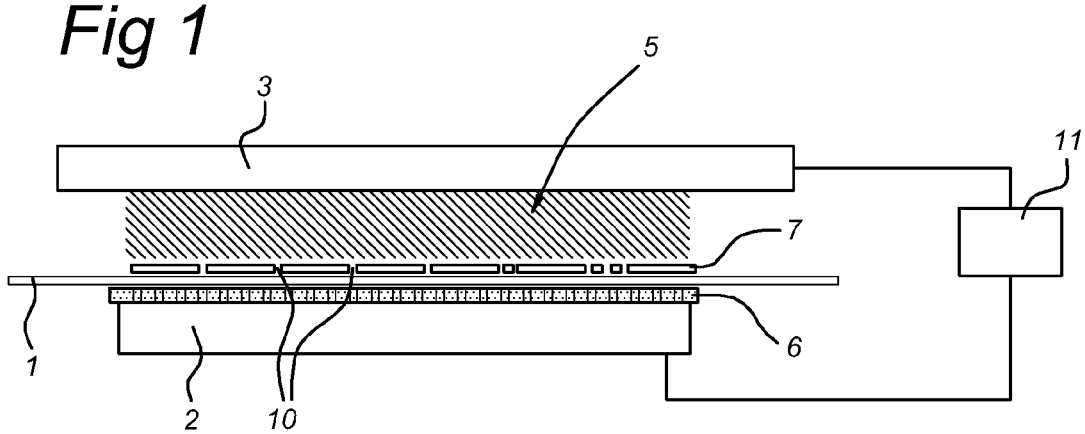

In embodiments of the present invention a standard dielectric barrier discharge (DBD) geometry is used in which atmospheric pressure plasma is generated. A cross sectional view of the configuration of a first embodiment of the present invention is shown in FIG. 1. Two electrodes 2, 3 are provided, forming a treatment space 5 in between. In the embodiment shown, the electrodes 2, 3 are planar electrodes, and the treatment space 5 is a rectangular space. However, other forms of the electrodes 2, 3 and of the treatment space 5 are possible, e.g. as part of a cylindrical arrangement of the plasma treatment apparatus.

A substrate 1 to be treated may be positioned in a fixed way or moving at a certain speed in the treatment space 5 close to one of the electrodes 2, 3. According to the present invention, a mask device 7 is used on top of the surface of substrate 1, which in its turn is positioned on top of a magnetic layer 6, which interacts with the mask device 7.

The mask device 7 may be made of conductive material, e.g. a metal mask device 7. To secure intimate contact between mask device 7 and the surface of substrate 1 the mask device 7 having a predetermined magnetic permeability can be held in close contact with the substrate 1 using the magnetic layer 6. For the best results, there is basically no space between the mask device 7 and the substrate 1, and if there would be a space at all, the distance between mask device 7 and substrate 1 should be e.g. less than 1 micrometer. The material to be treated (substrate 1) is sandwiched between the mask device 7 and magnetic layer 6. This solution has the advantage that the bulk plasma generated in treatment space 5 is not obstructed. Main advantages are that the bulk plasma ignites at normal low breakdown voltages and the gas supply to the holes in the mask device 7 towards the surface of the substrate 1 is by diffusion from the bulk plasma.

The magnetic layer 6 is positioned on the bottom (or first) electrode 2, e.g. in the form of a magnetic layer 6. As an alternative, the magnetic layer 6 is arranged as part of the bottom electrode 2. The mask device 7 is made of a thin material, in which a pattern is provided as holes or openings 10 in the material for patterning the surface of the substrate 1. As a result, the substrate 1 is sandwiched between the mask device 7 and the magnetic layer 6.

Figure 3:
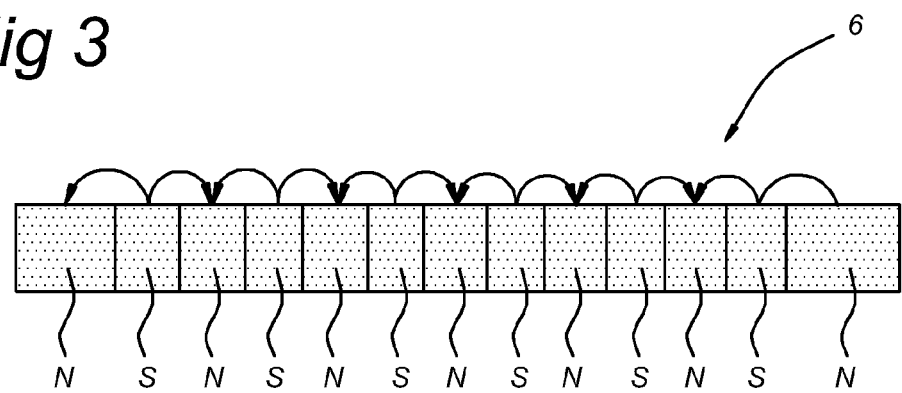
FIG. 3 shows a cross sectional view of an example of a magnetic layer used in the plasma treatment apparatus of FIG. 1 or FIG. 2.

In one embodiment, the magnetic layer 6 e.g. comprises small line shaped alternating north and south poles as shown in the cross sectional view of FIG. 3 which have good interaction with the mask device 7. The magnetic layer 6 can either be conductive or non-conductive. In an example, a magnetic layer 6 was used obtainable from Bakker Magnetics, available under the name 'Natural Magnetic foil', which comprises a semi-anisotropic magnetic layer. This flexible foil comprises alternating magnetic poles at a predefined pitch distance (see e.g. the embodiment shown in FIG. 3) Also other flexible magnetic layers from other suppliers may be used. In another magnetic layer 6 which may be used, the magnetic layer e.g. comprises randomly oriented alternating magnetic poles. The thickness of the foil used is as low as possible in order not to interfere with the generation of the glow discharge plasma in the treatment space 5. The thickness of the magnetic layer 6 is e.g. less than 1 mm, e.g. 0.75 or 0.5 mm. In another embodiment also foils may be used with a thickness of more than 1 mm, for example 1.5 or 2 mm or even more. The magnetic layers 6 suitable for use in this invention have as a fundamental property, that the magnetic field extends through the substrate 1 into the mask device 7 to allow a sufficiently strong attraction force. In order to have this sufficient attractive force the magnetic force should be evenly distributed over the surface of the magnetic layer 6 and exerts a magnetic force of between 5 and 100 g/cm$^2$, e.g. 19 or 41 g/cm$^2$. A higher magnetic force will allow to use a thinner mask device 7 (less material to attract).

The mask device 7 is made of a material which may have a magnetic permeability of at least 1 Tm/A, e.g. equal to or larger than 5 Tm/A. Very good results are obtained with the mask device having a magnetic permeability of 100, or 500 or 1000 Tm/A or any value in between. Material having such magnetic permeability can be selected from ferromagnetic material, or martensitic or austenitic material having ferromagnetic properties. It is furthermore known, that the attraction between a magnetic material and a material attractive for magnetic force is dependant on the thickness of an intermediate layer (i.e. the substrate 1) and the mask device 7. In further embodiments, the thickness of the mask device 7 is chosen as small as possible in order to have a good interaction with the magnetic layer 6 and as little as possible interference with the generation of the plasma in the treatment space 5. For this, the thickness of the mask device 7 is less than 1 mm, e.g. less than 0.4 mm, e.g. 0.1 or 0.05 mm.

Figure 2:
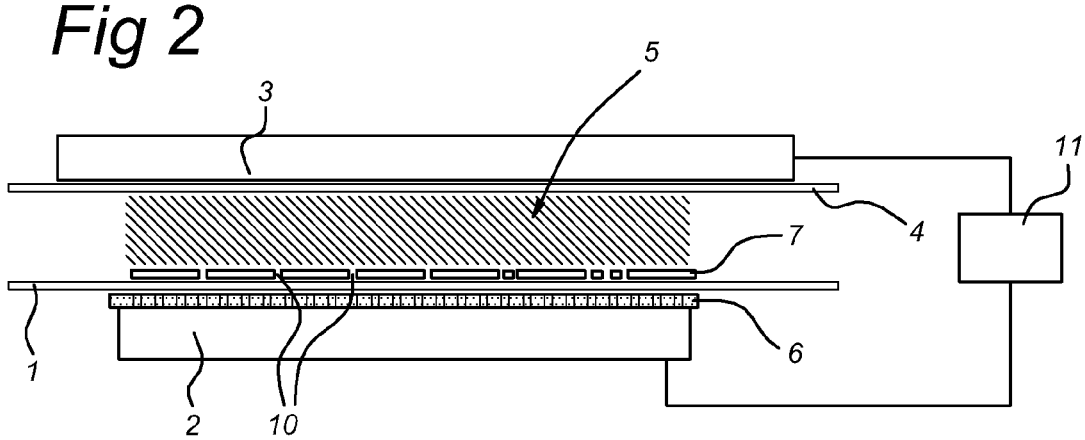
FIG. 2 shows a cross sectional view of a second embodiment of a plasma treatment apparatus according to the present invention.

In FIG. 2 a cross sectional view is shown of a plasma treatment apparatus according to a further embodiment of the present invention. The DBD structure of the apparatus according to FIG. 1 is enhanced by using a further dielectric barrier 4 on the surface of the top (second) electrode 3 directed at the treatment space 5. This will enhance the generation of a stable plasma in the treatment space 5 and may help in providing a stable and uniform glow discharge plasma in case this is needed.

In an embodiment where a glow discharge plasma may be used advantageously the formation of a glow discharge plasma may be stimulated by controlling the displacement current using a plasma control unit 11 connected to the electrodes 2, 3 (see FIGS. 1 and 2), and by controlling the distance between electrodes 2, 3, the glow discharge plasma formation can be promoted even into the small holes 10 in the mask device 7, leading to a uniform activation of the (unmasked) surface of substrate 1. The plasma control unit 11 e.g. comprises a power supply and associated control circuitry as described in the pending international patent application PCT/NL2006/050209, and European patent applications EP-A-1381257, EP-A-1626613 of applicant, which are herein incorporated by reference. The mask device 7 can be either on a floating potential, be grounded, or be on the same potential as the first (bottom) electrode 2. Depending on the type of material used for the mask device 7 and the substrate 1, and the type of application, these alternatives may provide an optimum result.

In a further embodiment of this invention also a treatment of a substrate surface is provided on the second (or top) electrode 3. In this embodiment at the same time two surfaces 1 can be treated in the vicinity of both electrodes 2, 3. The set-up and embodiments applicable for the first electrode 2 can also be applied to the second electrode 3 (i.e. sandwich structure of magnetic layer 6, substrate 1 and mask device 7).

As the plasma generating electrodes 2, 3 have a finite surface area a mechanism may be provided capable of moving the substrate 1 through the treatment space 5, in order to expose a complete substrate surface. In the embodiment with a moving substrate 1 in one exemplary embodiment the magnetic layer 6 is in size at least 90% of the total circumference area of the mask device 7, e.g. 100% or more, and the complete package of magnetic layer 6 and mask device 7, with the substrate 1 in between is moved trough the treatment space 5.

Example 1

The present method and apparatus may be used for a localized activation of a hydrophobic substrate 1. A thin film of poly-ethylene (PE), is placed in the treatment space 5 of the apparatus of FIG. 1. An argon/nitrogen (5:1) mixture (first example) or an argon/oxygen mixture (5:0.1) (second example) is introduced in the treatment space 5, and a short plasma treatment of 10 seconds was applied (frequency 130 kHz, duty cycle 2% (i.e. the ratio between plasma on time and plasma off time), pulse on-time of 100 μsec). By controlling the displacement current and electrode distance, a glow discharge plasma is generated which result in a uniform activation of the (unmasked) surface parts. In the first case, mainly amine/amide-like groups are formed on the surface of the substrate 1, and in the second case mainly peroxy-, hydroxy- and carboxy-groups are formed. In both cases, the surface of the PE substrate 1 becomes hydrophilically patterned, which for example allows easy printing.

Some examples of the possible surface modifications are shown in the table below.

| Gas mixtures | Chemical bonds formed |
|---|---|
| Ar + N2 | =NH, —NH2 |
| N2 + NH3 | —NH2 |
| Ar + O2 | —OH, C=O |
| N2 + CO2 | —COOH |

Different masks were used to pattern the hydrophobic polymer surface of the PE substrate 1.

Figure 4:
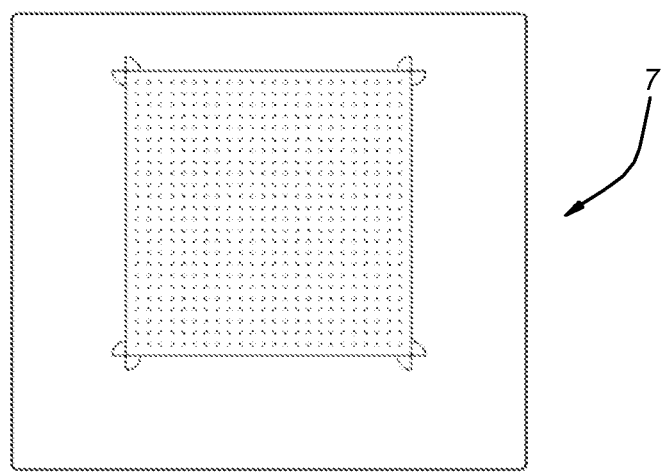
FIG. 4 shows a top view of a typical mask device with defined structures.

Three different masks (length 90 mm*width 80 mm/0.10 mm thick/AISI 301 material) were produced having different pitch distance (the pitch distance being defined as the distance from the centre point of each square to its direct neighbour square centre point. One mask has a 24 by 24 array of open squares enabling plasma activation with a 0.5 mm square diameter and with a 2.0 mm pitch distance (see top view of embodiment of mask device 7 in FIG. 4), the second one having an array of 96 by 24 squares with 0.1 mm square diameter and with 0.2 mm pitch distance and the third mask having an array of 192 by 192 squares and with a square diameter of 0.02 mm and with 0.04 mm pitch distance. (The last two are not shown here).

Figure 5:
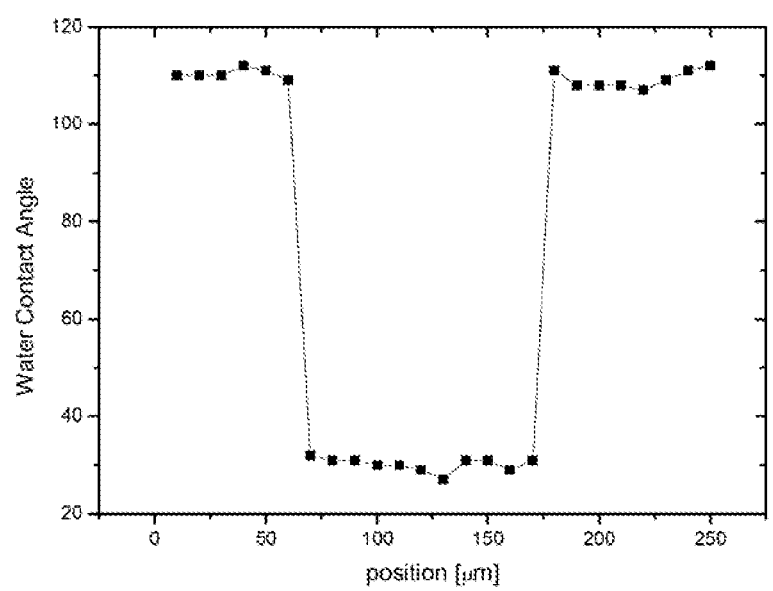
FIG. 5 shows a graph representing a typical result of a water contact angle measurement on a plasma patterned substrate.

A typical scan across a small part of the plasma patterned substrate 1 is shown in FIG. 5, showing the energy well formed by plasma patterning using the mask of 0.2 mm pitch distance and 0.1 mm square diameter. A Krüss micro contact angle measurement apparatus was used generating 10 pl droplet size. It is clear from FIG. 5 that it is possible to realize patterns with predefined structures of hydrophobic/hydrophilic areas (or vice versa) and sharp transitions between hydrophilic and hydrophobic area (or vice versa) on substrates 1 by this invention which may be very useful in applications such as micro titer plates manufacturing, electrically conductive paths manufacturing and even transparent conductive patterns manufacturing on substrates 1.

In order to quantitatively describe the sharp transition from hydrophilic to hydrophobic or vice versa we have defined a parameter which characterises how sudden the wettability transition η "happens".

$$\eta = \left| \frac{WCA(x_2) - WCA(x_1)}{x_2 - x_1} \right| [°/\mu m]$$

Where x2 and x1 represent the position of the droplets deposited at the border of the surface energy well. Difficulty is that the droplet cannot be deposited on the corner because the droplet will then move in to the surface energy well.

From the graph of substrate 1 in FIG. 5 an η=8°/μm can be derived, which indicates that sharp transitions between the hydrophilic to hydrophobic area (or vice versa) can be achieved smaller than 10 micron. To obtain even more detailed information about the typical sharpness of the wettability transition more detailed analysis measurements were carried out with the micro contact angle equipment using 1 and 5 pl droplets taking intervals as small as 1 μm. Based on these measurements an η=50°/μm is observed, which indicates the transition between the hydrophilic to hydrophobic area (or vice versa) are very sharp and even smaller than 2 micron e.g. even 0.2 micron.

Figure 6:
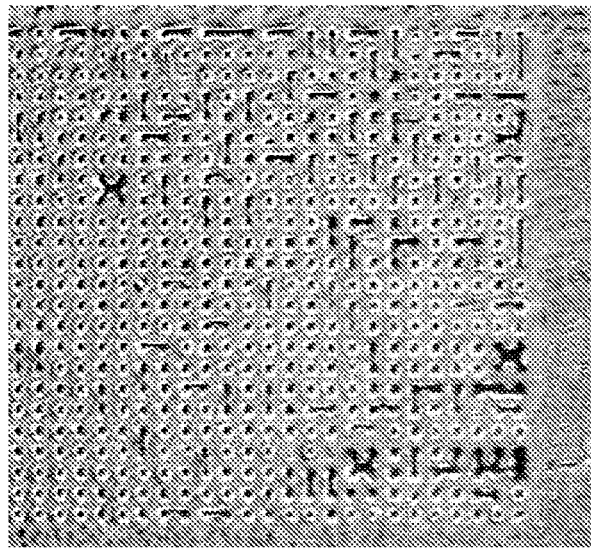
FIG. 6 shows a picture of a typical result after inkjet printing a plasma patterned substrate.

Advantageously, the invention can be used in the application of inkjet printing. Although the inkjet printing nozzle may have a less accurate output, the method according to the present invention allows to control the hydrophobic/hydrophilic surface parts very accurately in a lateral scale. The liquid ink dispensed by the nozzle will automatically move to the area of highest surface energy. This so-called self-alignment (the movement of ink to move to the area of highest surface energy) is clearly visible in the picture shown in FIG. 6. In this particular example the mask with a pitch distance of 0.2 mm and 0.1 mm square diameter was used on a PE-substrate 1 during the plasma patterning while after this treatment the patterned substrate 1 was printed with a 1 pl print head using a solid print pattern file and a standard black water-based ink by a DMP2831 printer from Fujifilm Dimatix. It is clear that in the plasma patterned area sharp defined structures are visible due to its precise plasma activation resulting in energy wells and as a result of self-alignment of the ink into the activated area while on the edge of the mask (which is non-treated by plasma) coagulation of hydrophilic ink-droplets occurs causing a blurry image because of absence of activated area.

Materials which also may be used to coat the substrate 1 are commercially available conductive inks containing for example silver-particles. Also, gel-based inks based on transparent conductive material can be used. The sol-gel will adhere only to those areas of the substrate 1 which are hydrophilic. Subsequently, the transparent conductive sol gel can be cured by a temperature step or by UV curing. In this manner, a patterned transparent layout can be printed on a polymer surface, which may be used for display applications, or photovoltaic cells.

It may be further clear from the shown example that the method and apparatus according to the present invention may be useful in the application of other printing techniques such as offset printing.

Example 2

Localized etching of a substrate 1 of polymeric base material (including Si wafer, glass, inorganic coatings, etc.) may also be executed using the present method and apparatus embodiments. In this example, the substrate 1 is a PE film. Two different gas mixtures were used, i.e. an argon/oxygen (5:1) mixture and a argon/$CF_4$ (5:0.1) mixture. Plasma treatment was carried out in a similar manner as in example 1, applying a total etching time of 60 seconds. After plasma exposure, the depth of trenches and wells in the substrate 1 was determined using a laser profilometer. In the case of argon/oxygen mixture, the etch rate was determined to be 500 nm/min, and in the case of the argon/$CF_4$ mixture, the etch rate was 1 μm/min. The present invention may also be used to etch a pattern on the surface of the substrate 1, e.g. by using a gas mixture of Ar, $CF_4$ and $H_2$ in the treatment space 5. Areas on the substrate surface exposed to the plasma can be etched in order to generate small holes or channels in e.g. a polymeric material. In case of etching filamentation of the plasma is of no problem. In this case also filamentary plasma's may be used.

Example 3

An ITO glass substrate 1 (0.7 mm thick) was spin coated with a hydrophobic photo resist of 1 μm thick. Again, argon/oxygen and argon/$CF_4$ mixtures were used to locally etch the photo resist layer. After two minutes of treatment time, the local water contact angle was determined. It was observed that the surface energy of the areas of the substrate 1 which were not covered by the mask device 7 have an extremely high surface energy of 70 mJ/m², indicating a complete removal of the photo resist. The surface energy of masked areas of the substrate 1 remained very low (typically 30 mJ/m²). This type of processing may be advantageously applied in the manufacturing of organic light emitting devices (OLED).

Example 4

The present method an apparatus embodiments may also be advantageously applied in deposition of material on a substrate, e.g. inorganic or organic layers, by localized chemical vapour deposition (CVD). E.g. small patterns of silicon oxide were produced. Even transparent conductive coatings can be produced so that a patterned electrically conductive path can be deposited on a dielectric substrate 1 (for instance a polymer). The dimensions of the structure obtainable are ideal for display applications. Furthermore, photovoltaic cell contacts can be realized in this way. Furthermore, the etching and deposition examples may be combined, e.g. to first etch the substrate 1 to form a well or trench and subsequently (possibly using another mask device 7) to locally deposit a coating in the well or trench. In the case of a deposition application filamentation of the plasma is not wanted and therefore atmospheric glow discharge plasma's are preferred in this application.

Other applications of the plasma treatment apparatus and method of the present invention include, but are not limited to, patterning applications as applied in Flex Circuits, RFID, PCB Photomasks, Wearable Electronics, Solar, Fuel Cells, Batteries, Flat Panel Displays, PLED, LCD, Color Filters, Display Backplanes, Flexible Displays, Microtiter plates for DNA, Proteomics, Antibodies identification Food Science, Pathogen Detection, medical devices, coatings, optical lenses, light pipes, etc. A surprising application is the deposition of a hydrophobic substance to a hydrophilic surface. For example by using an Ar/C2F6 plasma, hydrophobic patterns can be provided an a hydrophilic surface.

The invention claimed is:

1. A method for the treatment of a substrate surface, the method comprising:
   (a) providing a dielectric barrier discharge electrode structure for generating an atmospheric pressure plasma in a treatment space between a first electrode and a second electrode,
   (b) providing a magnetic layer on a surface of at least the first electrode,
   (c) contacting a substrate with the magnetic layer,
   (d) contacting a mask device with the substrate, the mask device interacting with the magnetic layer, and
   (e) applying a plasma generating power to the first and second electrodes thereby treating a surface of the substrate exposed by the mask device.

2. The method according to claim 1, in which the mask device comprises material with a magnetic permeability of at least 1 Tm/A.

3. The method according to claim 2, in which the mask device comprises material with a magnetic permeability equal to or larger than 5 Tm/A.

4. The method according to claim 2, in which the mask device has a thickness less than 1 mm.

5. The method according to claim 4, in which the mask device has a thickness less than 0.4 mm.

6. The method according to claim 1, in which the magnetic layer has a thickness of less than 1 mm.

7. The method according to claim 6, in which the magnetic layer has a thickness of less than 0.5 mm.

8. The method according to claim 4, in which the magnetic layer has a magnetic force between 5 g/cm² and 100 g/cm².

9. The method according to claim 1, in which the mask device is on a floating potential, grounded, or at first electrode potential.

10. The method according to claim 1, in which the generated plasma is an atmospheric pressure glow discharge plasma or a filamentary atmospheric plasma.

11. The method according to claim 1, in which applying a plasma generating power comprises controlling a displacement current to the first and second electrode.

12. The method according to claim 1, in which the treatment provides the surface of the substrate with a predefined pattern.

13. The method according to claim 1, in which the treatment provides a hydrophobic substrate with a predefined hydrophilic pattern.

14. The method according claim 13, in which a transition length between hydrophobic and hydrophilic areas of the hydrophobic substrate is less than 10 microns 15. The method according to claim 14, in which a transition length between hydrophobic and hydrophilic areas of the hydrophobic substrate is less than 2 micron.

16. The method according to claim 15, in which a transition length between hydrophobic and hydrophilic areas of the hydrophobic substrate is or e.g. less than 0.2 micron.

17. The method according to claim 1, in which the treatment is etching the surface of the substrate with a predefined pattern.

18. The method according to claim 1, in which the treatment deposits material in a predefined pattern on the surface of the substrate.

19. The method according to claim 18, in which the treated substrate is printed on using a material selected from the group consisting of: water based ink, conductive ink, and gel based ink.

* * * * *